United States Patent [19]
Van der Pol

[11] Patent Number: 6,040,741
[45] Date of Patent: Mar. 21, 2000

[54] PREAMPLIFIER FOR AMPLIFYING SIGNAL VOLTAGES FROM A SIGNAL SOURCE WITH HIGH SOURCE IMPEDANCE

[75] Inventor: Roland Van der Pol, Venlo, Netherlands

[73] Assignee: Krohne Messtechnik GmbH & Co. KG, Germany

[21] Appl. No.: 08/868,849

[22] Filed: Jun. 4, 1997

[51] Int. Cl.$^7$ .................................................... H03F 3/04
[52] U.S. Cl. ............................................. 330/297; 330/68
[58] Field of Search ............................. 330/76, 68, 156, 330/202, 292, 297

[56] References Cited

U.S. PATENT DOCUMENTS

| | | | |
|---|---|---|---|
| 3,521,179 | 7/1970 | Blancke | 330/30 |
| 3,860,882 | 1/1975 | Maltby et al. | 330/26 |
| 4,479,093 | 10/1984 | Mattisson | 330/297 X |
| 4,751,471 | 6/1988 | Dunseath, Jr. | 330/292 X |
| 5,216,382 | 6/1993 | Ito | 330/267 |

FOREIGN PATENT DOCUMENTS

| | | |
|---|---|---|
| 2 572 604 | 5/1986 | France . |
| 19 18 618 | 10/1970 | Germany . |
| 101 789 | 11/1973 | Germany . |
| 134 711 | 12/1977 | Germany . |

OTHER PUBLICATIONS

Thomas, "Input Capacitance Feedback Improves Neutralization", Electronics, pp. 112, 113, Jan. 1977.

Younge, "Bootstrapping Bias Supply Increases IC Voltage Capacity", Electronics, vol. 41, No. 22, pp. 90, 91, Oct. 1968.

Schaltungspraxis, Elektronik 1975, Heft 11, pp. 93, 94.

Hichman I: "Bootstrap Base To Bridge Building"; Electronics World and Wireless World, Bd. 98, Nr. 1678, Oct. 1, 1992, pp. 868–870, XP000315544.

*Primary Examiner*—Robert Pascal
*Assistant Examiner*—Khanh Van Nguyen
*Attorney, Agent, or Firm*—Cesari and McKenna, LLP

[57] ABSTRACT

A preamplifier for amplifying signal voltages from a signal source with high source impedance has a signal input connected to the signal source, a first supply voltage terminal connected to the first power supply voltage potential, a second supply voltage terminal connected to a second power supply voltage potential and a signal output supplying an output signal. In this preamplifier, the first and second power supply voltage potentials can be shifted in parallel depending on the output signal. Alternatively or cumulatively, a known preamplifier may be developed so that the potential of a shield for the signal source can be controlled by the output signal.

8 Claims, 4 Drawing Sheets

6,040,741

PREAMPLIFIER FOR AMPLIFYING SIGNAL VOLTAGES FROM A SIGNAL SOURCE WITH HIGH SOURCE IMPEDANCE

FIELD OF THE INVENTION

A first teaching of the invention concerns a preamplifier for amplifying signal voltages from a signal source with high source impedance having a signal input connected to the signal source, a first supply voltage terminal connected to a first power supply voltage potential, a second supply voltage terminal connected to a second power supply voltage potential and a signal output supplying an output signal.

BACKGROUND OF THE INVENTION

There are many preamplifiers known from the state of the art and designed for a wide variety of applications. One special problem using preamplifiers occurs in cases in which the signal voltage to be amplified comes from a signal source with high or very high source impedance. For example, it can be found that when transmitting relatively low-frequency signals via low coupling capacity on conventional operational amplifiers frequently used as preamplifiers and connected as voltage sequencers with high leakage resistance, high signal losses occur. These signal losses are, naturally, unwanted.

A second teaching of the invention concerns a preamplifier for amplifying signal voltages from a signal source with high source impedance with a signal input connected to the signal source and a signal output supplying an output signal.

When preamplifiers are used to amplify signal voltages from a signal source with high source impedance, it is known to be a problem that, because of the high to very high source impedance, the signal voltage is very sensitive to outside electrical fields. Such outside electrical fields can cause high signal losses even before the preamplifier.

TEACHING OF THE INVENTION

The task of the invention is, therefore, to design and develop the known preamplifier so that a signal voltage from a signal voltage source with high source impedance can basically be amplified with no signal losses.

According to a first teaching of the invention, the task previously indicated and described is solved by having the first and second power supply voltage potentials able to shift in parallel depending on the output signal.

The invention recognizes that the high signal losses that occur, for example when amplifying a signal voltage from a signal source with high source impedance using an operational amplifier connected as a voltage sequencer, are basically due to the fact that leakage currents flow off via parasitic capacitances between the signal input of the operational amplifier and the first or second supply voltage terminal of the operational amplifier which is at a constant potential in the state of the art. These leakage currents occur the same way in other known preamplifiers.

The invention's coupling of the first and second supply voltage potentials to the output signal of the preamplifier makes it possible at least to reduce, if not completely eliminate, the leakage current via the parasitic capacitances—because of the reduced or even no longer fluctuating potential differences on the parasitic capacitances.

Practical experiments have shown that, for example, on a 25-Hz signal source with a capacitor connected in series with a capacity of 10 pF as source impedance on conventional preamplifiers, there is a signal loss of about 20%. The invention's shifting of the first and second power supply voltage potentials depending on the output signal of the preamplifier reduces the signal loss for the same signal source during transmission to less than 0.01%.

According to the invention's first teaching, the preamplifier has a first advantageous design in which it is built as a voltage sequencer. Designing the preamplifier like this guarantees that shifting the supply voltage potentials depending on the output signal is very easy even with the complete elimination of the influences of the parasitic capacitances being sought.

Alternately, having the preamplifier according to the first teaching of the invention amplify the signal voltage as a rule makes it more difficult to shift the supply voltage potential depending on the output signal under conditions of reduced leakage current, but at the same time guarantees an actual increase in the signal level without signal losses in the preamplification stage.

Depending on the characteristics of the preamplifier, under certain circumstances, it is advantageous to shift the first and second supply voltage potentials directly depending on the amplified output signal.

Now, if the preamplifier in the first teaching of the invention is designed so that the first and second supply voltage potentials can be shifted directly depending on the attenuated output signal, with 95% attenuation, this does not completely eliminate the parasitic capacitances, but does generally guarantee an increase in the stability of the preamplifier.

Another measure to stabilize the preamplifier is to make the first and second power supply voltage potentials able to shift depending on the low-pass filtered output signal.

If the preamplifier in the first teaching of the invention is designed as a voltage sequencer, it is particularly advantageous to design the preamplifier so that the output signal is used directly as a reference potential for the power supply voltage sources supplying the respective supply voltage potentials. This guarantees that it is very easy to shift the supply voltage potentials so that the leakage currents via the parasitic capacitances of the preamplifier are eliminated.

Particularly in the version of the preamplifier according to the first teaching of the invention, in which the signal voltage is amplified simultaneously, it is very advantageous to design the preamplifier so that the respective supply voltage potentials can be drained off by attenuator from the output signal and the potential of a power supply voltage source. By choosing the attenuator, the respective supply voltage potential can thus also be slewed from an amplified output signal so that the interference of the parasitic capacitances is at least largely eliminated.

Producing the preamplifier according to the first theory of the invention is particularly easy if it is designed as an operational amplifier. With an operational amplifier, influencing the supply voltage potentials is very easy and has few reactions on the output signal.

The task previously indicated and described is solved by the preamplifier in the second theory of the invention by making the potential of a shield for the signal source able to be controlled by the output signal. This design of the preamplifier guarantees that outside interfering fields or parasitic capacitances between the signal source, on one hand, and the environment, on the other hand, because of the small source impedance of the output signal of the preamplifier, can have only little or no influence on the signal voltages of a signal source with high source impedance.

According to a first alternative embodiment of the preamplifier according to the second theory of the invention, the shield is arranged between the signal source and the signal input. This arrangement guarantees that the power supply voltage potentials of the preamplifier can also not interfere with the signal voltages.

According to the second alternative embodiment of the preamplifier according to the second theory of the invention, the shield is arranged in the preamplifier signal output area, so that the signal source is guaranteed shielded up to the signal input.

Now there are many ways of designing and developing the preamplifier of the invention to amplify signal voltages from a signal source with high source impedance. For them, please refer, on one hand, to the dependent patent claims, and on the other hand, to the description of the preferred embodiments in connection with the drawings.

BRIEF DESCRIPTION OF THE DRAWINGS

In the drawings:

FIG. 1 shows a preamplifier as it is known from the state of the art. If such a preamplifier is used to amplify signal voltages from a signal source 1 with high source impedance, the leakage currents flowing through the parasitic capacitances 6, 7 lying between one signal input 3 and a first power supply voltage terminal 4 or a second power supply voltage terminal 5 within the preamplifier designed as an operations amplifier 2.—here connected as a voltage sequencer—cause substantial signal loss. In the example of embodiment of a preamplifier known from the state of the art, it is designed as a voltage sequencer using the operational amplifier 2.

DETAILED DESCRIPTION OF ILLUSTRATIVE EMBODIMENTS

Figure 1:
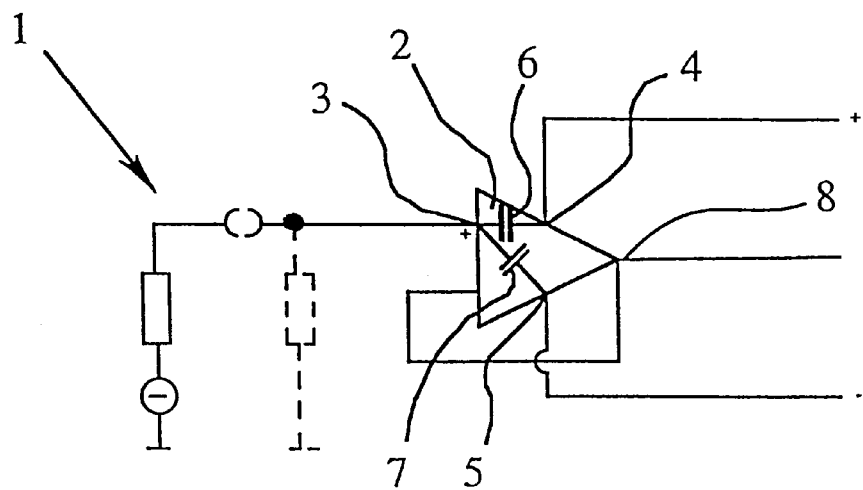
FIG. 1 shows an example of embodiment of a preamplifier known from the state of the art.

In the following figures, identical components have the same reference numbers and letters as in FIG. 1.

Figure 2:
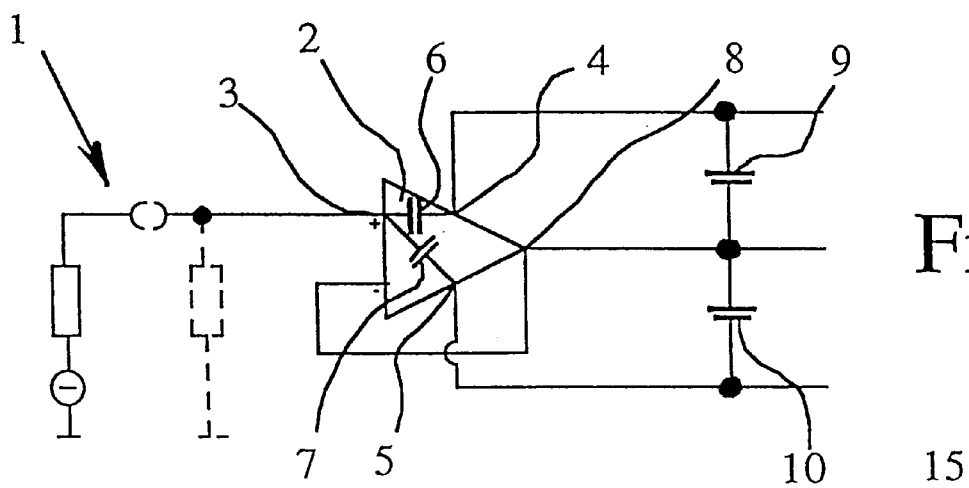
FIG. 2 shows a first example of embodiment of a preamplifier according to the first theory of the invention.

In the first example of the embodiment shown in FIG. 2 of an amplifier according to the first teaching of the invention, the preamplifier is, in turn, made up of an operational amplifier 2 connected as a voltage sequencer, to whose signal input 3 the signal voltage of a signal source 1 with high source impedance is applied. Also in the operational amplifier 2 shown in FIG. 2, between the signal input 3 and the first supply voltage terminal 4 or the second supply voltage terminal 5, there are parasitic capacitances 6, 7. The negative influence of the parasitic capacitances on the signal voltages is, however, at least sharply reduced by the invention due to the fact that the first and second supply voltage potentials can shift in parallel depending on the output signal from the preamplifier at the signal output 8. In the first example of embodiment of an amplifier according to the first theory of the invention, this is guaranteed by the fact that the output signal is used directly as a reference potential for the power supply voltage sources 9, 10 (illustrated as batteries) supplying the respective supply voltage potentials.

Figure 3:
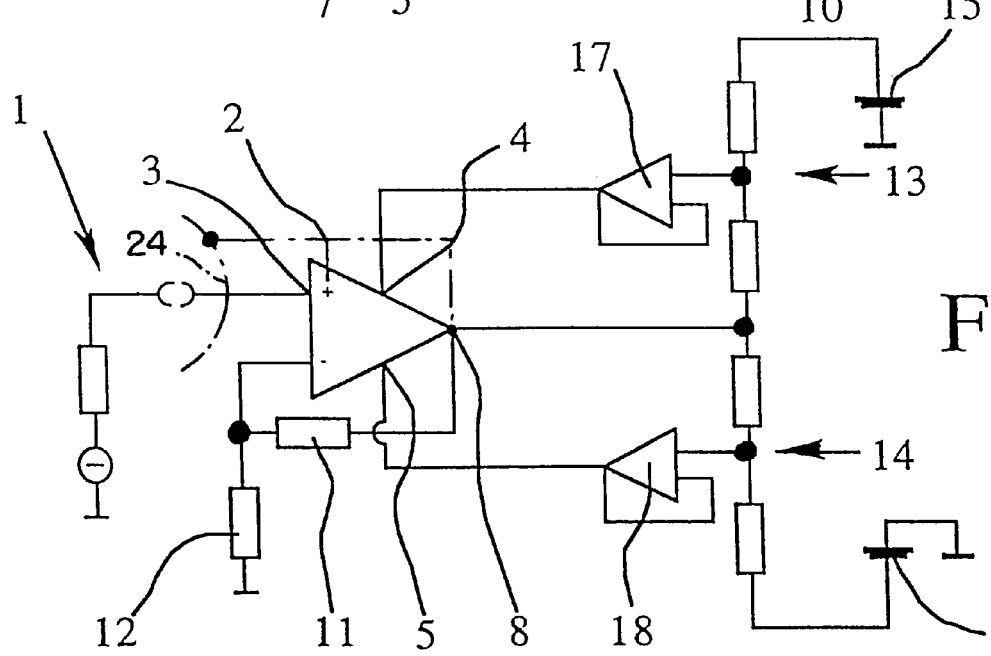
FIG. 3 shows a second example of embodiment of a preamplifier according to the first theory of the invention.

FIG. 3 of the drawings shows a second example of an embodiment of a preamplifier according to the first theory of the invention, in which the preamplifier constructed from an operational amplifier 2 and two resistors 11, 12 determining the amplification factor amplifies the signal voltage. To avoid leakage currents via parasitic capacitances despite this amplification of the output signal compared to the signal voltage, in the second example of embodiment shown in FIG. 3, the respective supply voltage potential can be drained via an attenuator 13, 14 from the output signal and the potential of a power supply voltage source 15, 16. In order not to stress the signal output 8 of the operational amplifier 2 too much, in the second example of embodiment shown in FIG. 2, a voltage sequencer 17, 18 is placed between the middle tap of the respective attenuator 13, 14 and the accompanying supply voltage terminals 4, 5.

Figure 4:
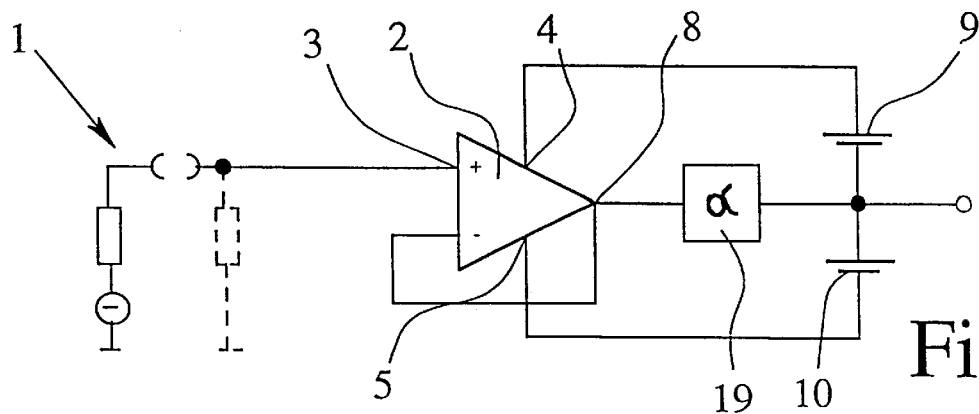
FIG. 4 shows a third example of embodiment of a preamplifier according to the first theory of the invention.

FIG. 4 of the drawings shows a third example of an embodiment of a preamplifier according to the first theory of the invention, in which the first and second supply voltage potentials can be shifted directly depending on the attenuated output signal. This is guaranteed for the preamplifier shown in FIG. 4 by an attenuator 19 connected in front of the power supply voltage sources 9, 10 connected as in FIG. 2.

Figure 5:
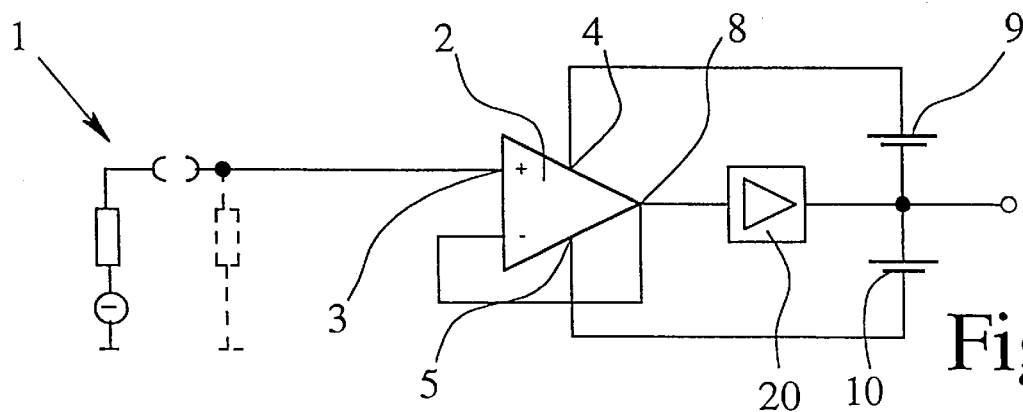
FIG. 5 shows a fourth example of embodiment of a preamplifier according to the first theory of the invention.

In contrast to this, FIG. 5 shows a fourth example of an embodiment of a preamplifier according to the first teaching of the invention, in which the operational amplifier 2 is, in turn, connected as a voltage sequencer, but the output signal of the operational amplifier 2 applied to the signal output 8 is amplified in an amplifier 20, wherein the supply voltage potentials of the operational amplifier 2 are drained directly from the amplified output signal of the operational amplifier 2 as in the first example of embodiment shown in FIG. 2.

Figure 6:
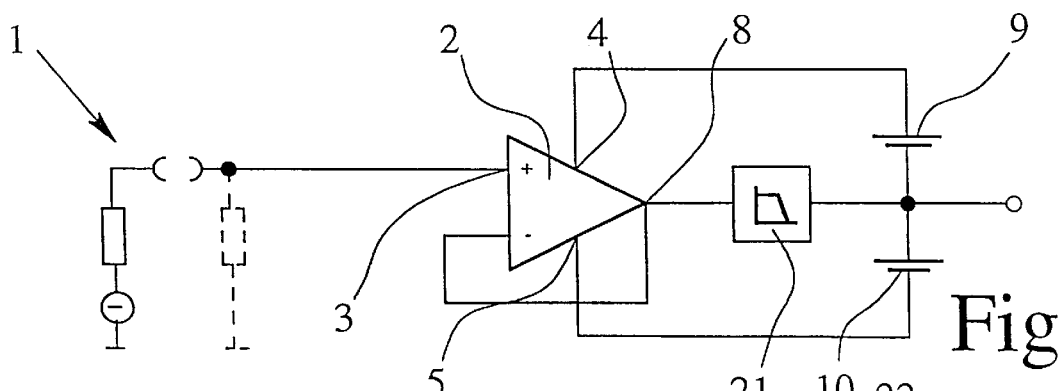
FIG. 6 shows a fifth example of embodiment of a preamplifier according to the first theory of the invention.

FIG. 6 of the drawings shows a fifth example of an embodiment of a preamplifier according to the first teaching of the invention, in which the output signal is filtered using a low-pass filter 21 connected to the signal output 8 of an operational amplifier 2 connected as a voltage sequencer. This filtered output signal is then used as the basis for shifting the supply voltage potentials as shown in FIG. 2.

Figure 7:
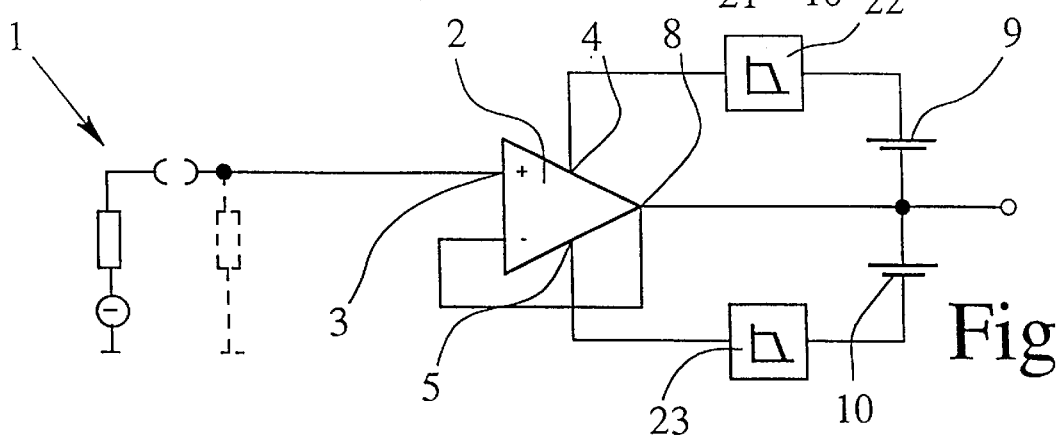
FIG. 7 shows a sixth example of embodiment of a preamplifier according to the first theory of the invention.

In order to avoid the problem that occurs in the fifth example of an embodiment shown in FIG. 6, that the output signal is also filtered now through the low-pass filter 21 for further processing, in the sixth example of embodiment shown in FIG. 7 according to the first theory of the invention, two separate low-pass filters 22, 23 are placed between the supply voltage sources 9, 10 and the power supply voltage terminals 4, 5.

Figure 8:
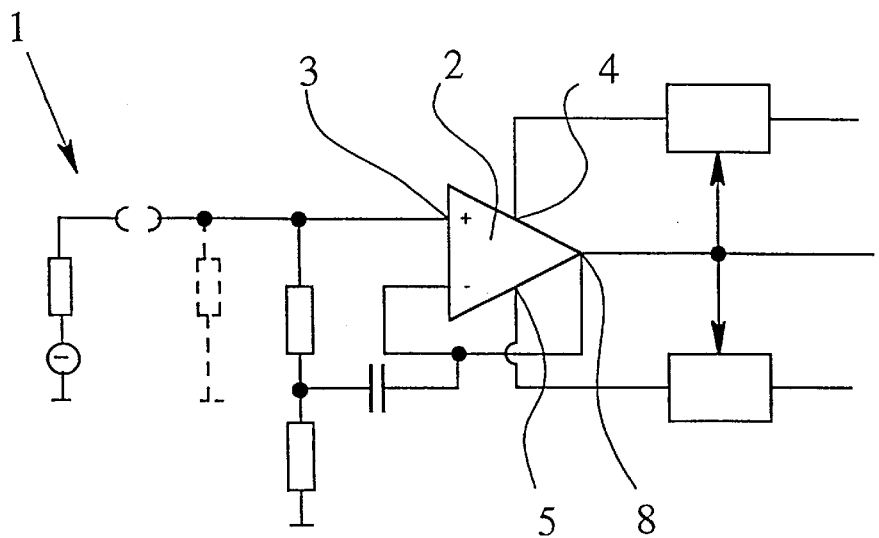
FIG. 8 shows a seventh example of embodiment of a preamplifier according to the first theory of the invention.

In the seventh example of an embodiment shown in FIG. 8, according to the first teaching of the invention, along with the measures taken in the first theory of the invention, other known measures are taken to increase the input impedance of the preamplifier.

Figure 9:
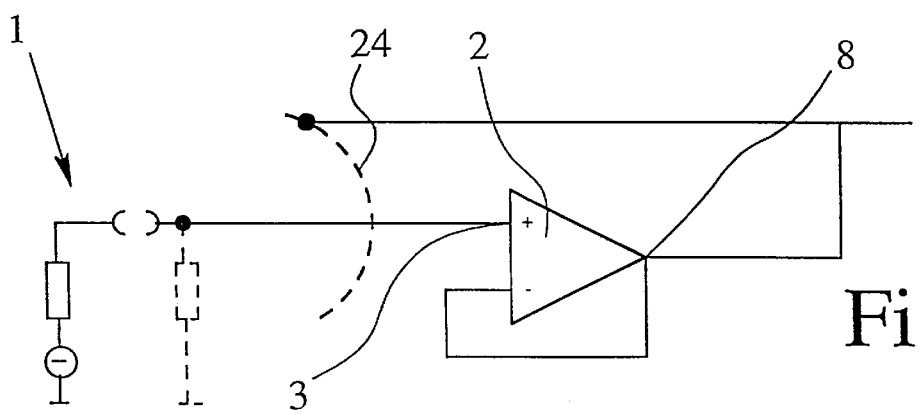
FIG. 9 shows an example of embodiment of a preamplifier according to the second theory of the invention.

FIG. 9 of the drawings shows an example of an embodiment of a preamplifier according to the second teaching of the invention. In this preamplifier, the potential of a shield, indicated at 24, of the signal source 1 lying between the signal source 1 and the signal input 3 can be controlled by the output signal of the preamplifier. The same thing can be done with the FIGS. 1–8 embodiments; see e.g., shield 24 shown in phantom in FIG. 3.

Figure 10:
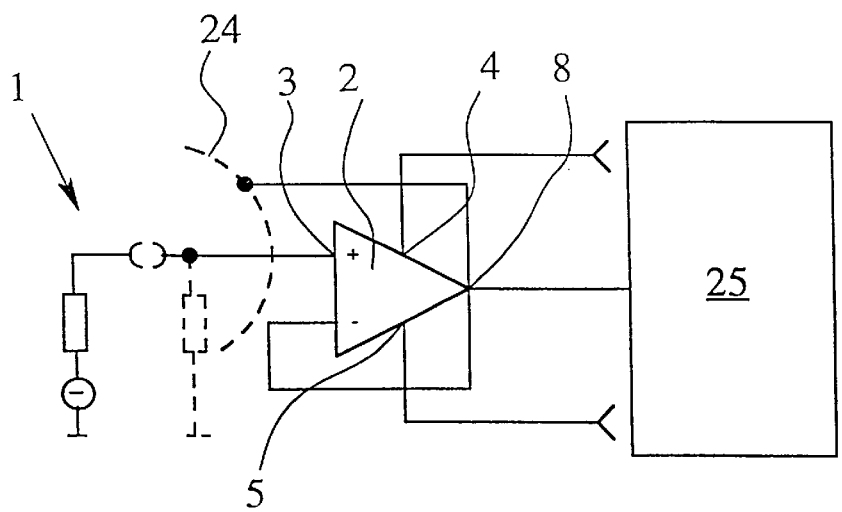
FIG. 10 shows a first example of embodiment of a preamplifier according to the first and second theories of the invention.

A first example of an embodiment of a preamplifier according to the first and second theories in the invention is shown in FIG. 10. Here, there is a parallel shift of the supply voltage potentials depending upon the output signal according to one of the examples of embodiment described above, done here with the help of a conventional shift circuit 25, shown only schematically, and at the same time, a shield 24 lying between the signal source and the signal input is boosted to the potential at the signal output 8.

Figure 11:
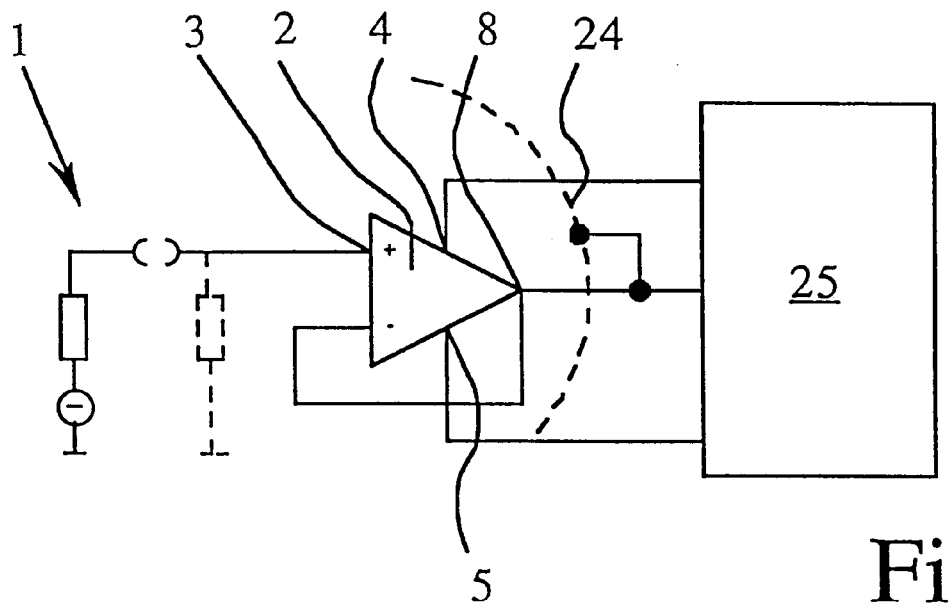
FIG. 11 shows a second example of embodiment of a preamplifier according to the first and second theories of the invention.

Alternately to this, FIG. 11 of the drawings shows a second example of an embodiment of a preamplifier according to the first and second theories of the invention, in which the shield 24 is arranged near the signal output 8 of the operational amplifier 2.

Figure 12:
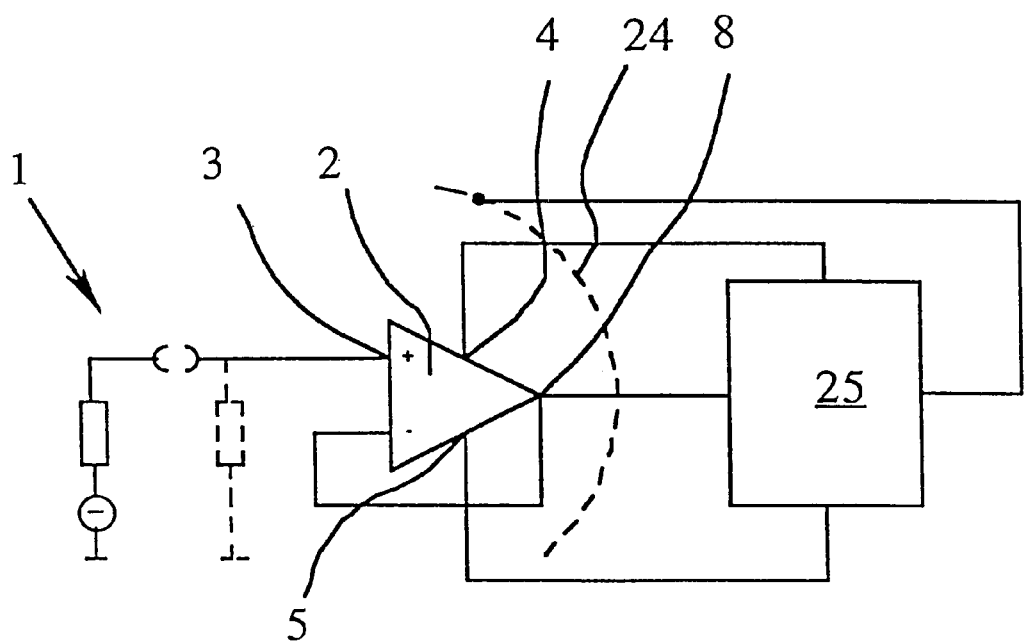
FIG. 12 shows a third example of embodiment of a preamplifier according to the first and second theory of the invention.

Finally, FIG. 12 of the drawings shows a third example of an embodiment of a preamplifier according to the first and second theories of the invention, in which the potential of the shield 24 can be controlled directly by the output signal, hence for example by an amplified output signal. This is an advantage, under certain circumstances, depending on the outside interference.

What is claimed is:

1. A preamplifier for amplifying signal voltages from a signal source (1) having high source impedance, with an operational amplifier (2), which operational amplifier (2) is provided with a signal input (3), a first supply voltage terminal (4) for a first supply-voltage potential, a second supply voltage terminal (5) for a second supply-voltage potential, and a signal output (8), the said signal output (8) delivering an output signal and the said first supply-voltage potential and the second supply-voltage potential permitting parallel shifting as a function of the output signal, wherein the signal output (8) can be connected via a first voltage divider (13) having a center pick-off tap to a first supply voltage source (15) and via a second voltage divider (14) having a center pick-off tap to a second supply voltage source (16) and the center pick-off tap of the first voltage divider (13) is connected via a first voltage follower (17) to the first supply voltage terminal (4) of the operational amplifier (2) and the center pick-off tap of the second voltage divider (14) is connected via a second voltage follower (18) to the second supply voltage terminal (5) of the operational amplifier (2) characterized in that the potential on a shielding (24) of the signal source (1) is controllable by the output signal.

2. The preamplifier as in claim 1 characterized in that the preamplifier is designed as a voltage follower.

3. The preamplifier as in claim 1 or 2, characterized in that the first and the second supply-voltage potentials can be shifted as a function of the low-pass-filtered output signal.

4. The preamplifier as in claim 3, characterized in that the shielding (24) is positioned between the signal source (1) and the signal input (3).

5. The preamplifier as in claim 3, characterized in that the shielding (24) is positioned in the area of the signal output (8).

6. The preamplifier as in claim 3 characterized in that the potential on a shield (24) of the signal source (1) is controllable by the output signal.

7. The preamplifier as in claim 6, characterized in that the shielding (24) is positioned between the signal source (1) and the signal input (3).

8. The preamplifer as in claim 6, characterized in that the shielding (24) is positioned in the area of the signal output (8).

* * * * *